United States Patent
Takizawa et al.

(10) Patent No.: US 12,061,222 B2
(45) Date of Patent: Aug. 13, 2024

(54) DETECTING DEVICE AND MANUFACTURING METHOD

(71) Applicant: ALPS ALPINE CO., LTD., Tokyo (JP)

(72) Inventors: Satoru Takizawa, Miyagi (JP); Takeshi Masaki, Miyagi (JP); Takashi Sasaki, Miyagi (JP); Hiroaki Takahashi, Miyagi (JP); Kazuhito Oshita, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 132 days.

(21) Appl. No.: 18/066,520

(22) Filed: Dec. 15, 2022

(65) Prior Publication Data

US 2023/0122321 A1     Apr. 20, 2023

Related U.S. Application Data

(63) Continuation of application No. PCT/JP2021/019410, filed on May 21, 2021.

(30) Foreign Application Priority Data

Jul. 16, 2020   (JP) ................................ 2020-122236

(51) Int. Cl.
*G01R 29/12*     (2006.01)
*G01V 3/08*      (2006.01)

(52) U.S. Cl.
CPC ............. *G01R 29/12* (2013.01); *G01V 3/088* (2013.01)

(58) Field of Classification Search
CPC .................................. G01R 5/28; G01R 29/12
See application file for complete search history.

(56) References Cited

U.S. PATENT DOCUMENTS

| | | | |
|---|---|---|---|
| 9,176,636 B1 | 11/2015 | Maharyta et al. | |
| 2012/0229195 A1* | 9/2012 | Shigetaka | G06F 3/0446 |
| | | | 327/517 |
| 2013/0321003 A1* | 12/2013 | Shimizu | G06F 3/0443 |
| | | | 324/663 |

FOREIGN PATENT DOCUMENTS

| | | |
|---|---|---|
| JP | 2010-286314 | 12/2010 |
| JP | 2013-105650 | 5/2013 |
| KR | 10-1862985 | 5/2018 |

OTHER PUBLICATIONS

International Search Report for PCT/JP2021/019410 mailed on Aug. 10, 2021.

* cited by examiner

*Primary Examiner* — Tung X Nguyen
(74) *Attorney, Agent, or Firm* — IPUSA, PLLC

(57) ABSTRACT

The electrostatic capacitance detecting device includes a first substrate; a detection electrode provided on a front-side surface of the first substrate to detect a proximity of an operating body to an operating face; a stray capacitance coupling conductor provided in a direction with respect to the first substrate, the direction being opposite to a direction of the detection electrode with respect to the first substrate; a first peripheral electrode provided on the front-side surface of the first substrate to surround the detection electrode; and a plurality of lateral electrodes provided side by side to surround the detection electrode, the plurality of lateral electrodes extending along a thickness direction of the first substrate and connected to each of the first peripheral electrode and the stray capacitance coupling conductor.

9 Claims, 13 Drawing Sheets

DETECTING DEVICE AND MANUFACTURING METHOD

CROSS-REFERENCE TO RELATED APPLICATION

The present application is a continuation filed under 35 U.S.C. 111 (a) claiming the benefit under 35 U.S.C. 120 and 365 (c) of PCT International Application No. PCT/JP2021/019410 filed on May 21, 2021, and designating the U.S., which is based on and claims priority to Japanese Patent Application No. 2020-122236, filed on Jul. 16, 2020. The entire contents of the PCT International Application No. PCT/JP2021/019410 and the Japanese Patent Application No. 2020-122236 are incorporated herein by reference.

BACKGROUND OF THE INVENTION

1. Field of the Invention

The present invention relates to a detecting device and a manufacturing method.

2. Description of the Related Art

In the related art, an electrostatic capacitance detecting device that detects a proximity of an operating body to an operating face based on a change in electrostatic capacitance at a detection electrode provided on the operating face is known. In such a detecting device, a technique in which a shield electrode is superposed on a back side of the detection electrode is known.

For example, Patent Document 1 below discloses an electrode system including a detection electrode, an annular shield electrode film surrounding the detection electrode, and a shield electrode film arranged under the detection electrode, and discloses a technique of electrically connecting the annular shield electrode film with the shield electrode film through a via.

CITATION LIST

[Patent Document 1] Japanese Patent Application Publication No. 2010-286314

SUMMARY OF THE INVENTION

Technical Problem

In the electrostatic capacitance detecting device of the related art, the detection electrode and an external ground near the electrostatic capacitance detecting device are capacitively coupled, and due to this, a great change is in self-capacitance of the detection electrode is caused even when, for example, a person approaches a lateral face of the electrostatic capacitance detecting device, and so there is a possibility of erroneous detection that the operating body is close to the operating face.

Solution to Problem

The electrostatic capacitance detecting device according to an embodiment is provided with a first substrate; a detection electrode provided on a front-side surface of the first substrate to detect a proximity of an operating body to an operating face; a stray capacitance coupling conductor provided in a direction with respect to the first substrate, the direction being opposite to a direction of the detection electrode with respect to the first substrate; a first peripheral electrode provided on the front-side surface of the first substrate to surround the detection electrode; and a plurality of lateral electrodes provided side by side to surround the detection electrode, extending along a thickness direction of the first substrate, and connected to each of the first peripheral electrode and the stray capacitance coupling conductor.

Advantageous Effect of the Invention

According to the embodiment, a compact electrostatic capacitance detecting device capable of preventing a false detection can be easily provided.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

One embodiment will be described below with reference to the drawings.

Figure 1:
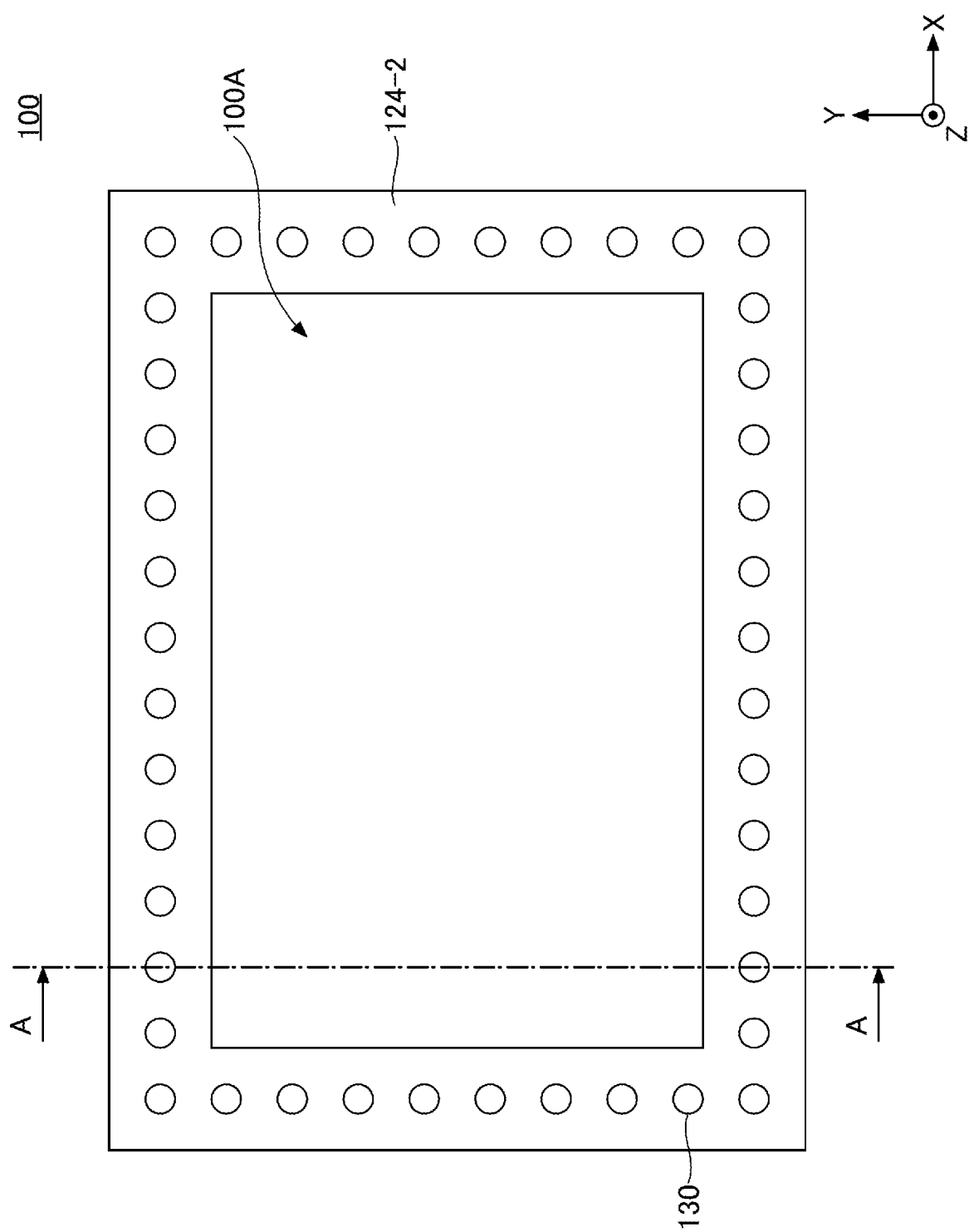
FIG. 1 is a plan view of an electrostatic capacitance detecting device according to one embodiment.

FIG. 1 is a plan view of an electrostatic capacitance detecting device 100 according to an embodiment. As depicted in FIG. 1, an electrostatic capacitance detecting device 100 is a device having an overall thin rectangular parallelepiped shape. A front-side surface of the electrostatic capacitance detecting device 100 includes an operating face 100A. The electrostatic capacitance detecting device 100 can detect a proximity of an operator's hand to the operating face 100A in accordance with a change in electrostatic capacitance.

For example, the electrostatic capacitance detecting device 100 is installed in a predetermined position (for example, a door handle, a center console, etc.) of a vehicle such as an automobile, and is used to control operations of the vehicle's electrical components (for example, a door lock, an audio, an air conditioner, etc.) in accordance with how proximate the operator's hand is. However, the application of the electrostatic capacitance detecting device 100 is not limited thereto, and the electrostatic capacitance detecting device 100 may be used for any application.

Figure 2:
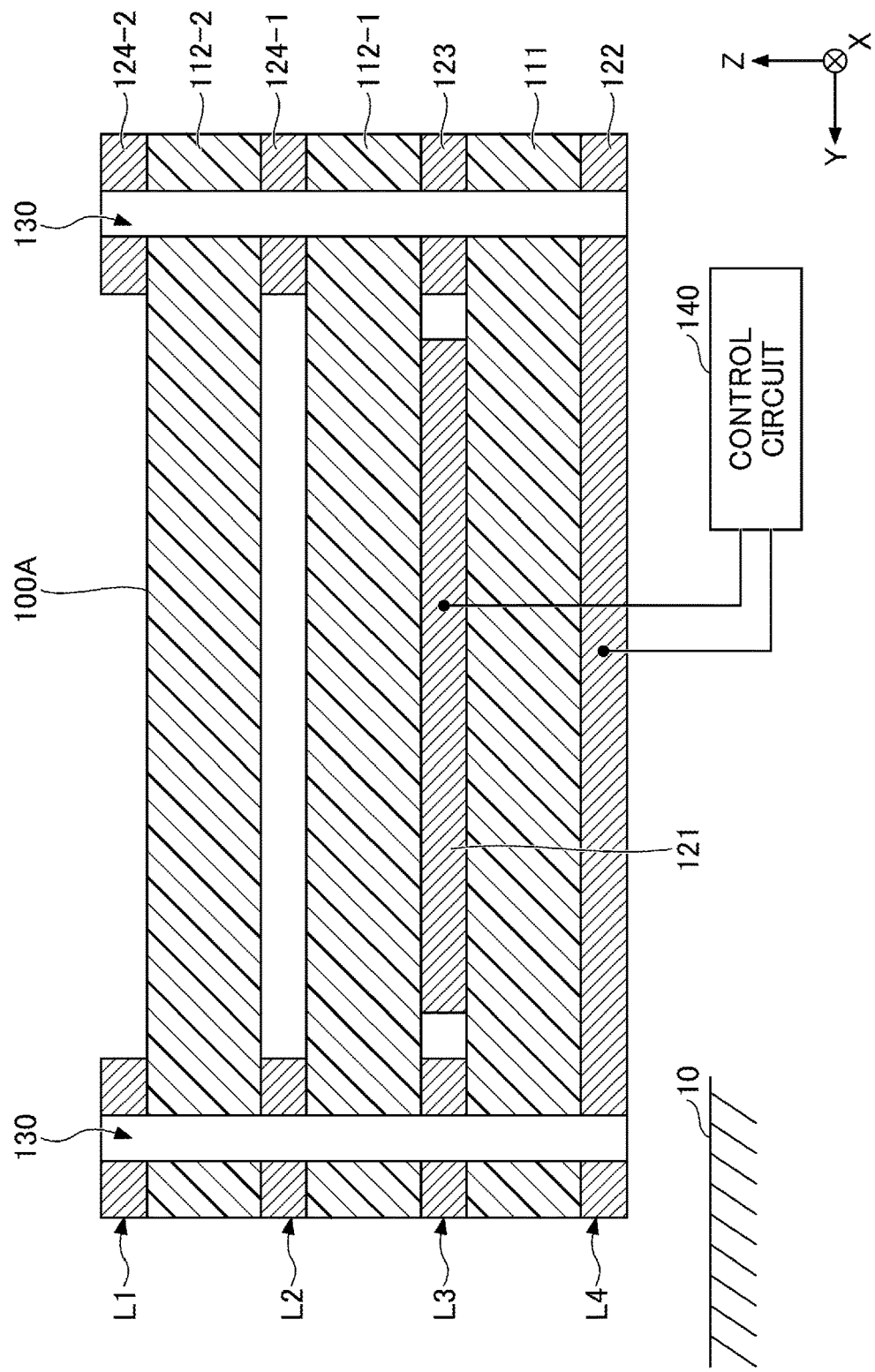
FIG. 2 is an A-A cross sectional view of the electrostatic capacitance detecting device according to the embodiment.
Figure 3:
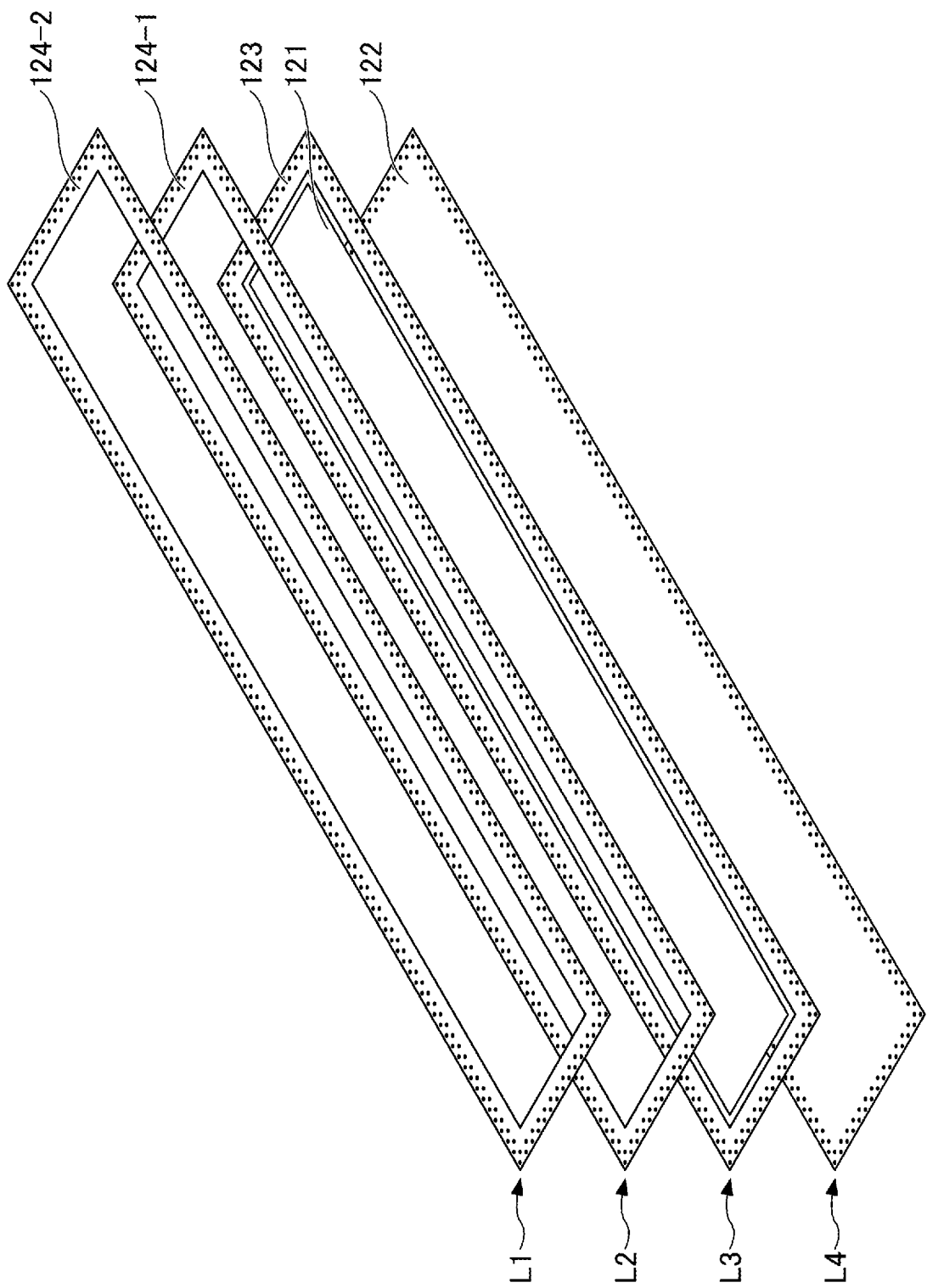
FIG. 3 is a perspective view depicting a configuration of each conductive layer provided in the electrostatic capacitance detecting device according to the embodiment.

FIG. 2 is an A-A cross-sectional view of the electrostatic capacitance detecting device 100 according to the embodiment. FIG. 3 is a perspective view depicting a configuration of each of the conductive layers L1-L4 provided in the electrostatic capacitance detecting device 100 according to the embodiment.

As depicted in FIG. 2, the electrostatic capacitance detecting device 100 includes a second substrate 112-2, a second substrate 112-1, and a first substrate 111 in the order from the operating face 100A. The electrostatic capacitance detecting device 100 has a so-called multilayer substrate structure in which these multiple substrates 112-2, 112-1, and 111 are stacked. Each of the substrates 112-2, 112-1, and 111 is a member like a flat plate and has a rectangular shape in plan view. For example, a printed wiring board (PWB) is used as each of the substrates 112-2, 112-1, and 111.

Also, as depicted in FIGS. 2 and 3, the electrostatic capacitance detecting device 100 includes a first conductive layer L1, a second conductive layer L2, a third conductive layer L3, and a fourth conductive layer L4 in the order from the operating face 100A. The first conductive layer L1 is formed on the front-side surface (that is, the operating face 100A) of the second substrate 112-2. The second conductive layer L2 is famed between the second substrate 112-2 and the second substrate 112-1. The third conductive layer L3 is formed between the second substrate 112-1 and the first substrate 111. The fourth conductive layer L4 is formed on the back-side surface of the first substrate 111. Each of the conductive layers L1-L4 is a thin conductive layer. For example, each of the conductive layers L1-L4 is famed of one of various sorts of conductive films (for example, a copper film).

As depicted in FIGS. 2 and 3, at a central portion of the third conductive layer L3, a detection electrode 121 having a rectangular shape in plan view (a rectangular shape smaller than the rectangular shape of each of the substrates 112-2, 112-1, and 111) is provided. The detection electrode 121 detects a proximity of an operating body to the operating face 100A. Specifically, the detection electrode 121 detects a proximity of an operating body to the operating face 100A in accordance with a change in a current flowing through the detection electrode 121. As depicted in FIG. 2, the detection electrode 121 is connected to a control circuit 140. The control circuit 140 drives the detection electrode 121, and can detect a proximity of an operator's finger to the operating face 100A by measuring a change in the current flowing through the detection electrode 121.

As depicted in FIGS. 2 and 3, a stray capacitance coupling conductor 122 is provided in the fourth conductive layer L4. The stray capacitance coupling conductor 122 has a shape (i.e., a rectangular shape) that covers the entire back-side surface of the second substrate 112-2 in plan view. As depicted in FIG. 2, the stray capacitance coupling conductor 122 is connected to the control circuit 140. To the stray capacitance coupling conductor 122, a drive signal having a waveform synchronized with a drive signal that is applied to the detection electrode 121 is applied by the control circuit 140. As a result, the stray capacitance coupling conductor 122 has the same electric potential as that of the detection electrode 121 and is capacitively coupled with an external ground 10 (see FIG. 2) that is near the electrostatic capacitance detecting device 100, so that capacitive coupling between the external ground 10 and the detection electrode 121 can be prevented. In this example, the control circuit 140 applies the drive signals to both the detection electrode 121 and the stray capacitance coupling conductor 122, but does not necessarily need to apply the drive signal to the detection electrode 121. That is, because the detection electrode 121 and the stray capacitance coupling conductor 122 are capacitively coupled, a signal having a waveform synchronized with the stray capacitance coupling conductor 122 can be applied also to the thus capacitively coupled detection electrode 121 as a result of the drive signal being applied to the stray capacitance coupling conductor 122.

As depicted in FIGS. 2 and 3, the first conductive layer L1, the second conductive layer L2, and the third conductive layer L3 are provided with a second peripheral electrode 124-2, a second peripheral electrode 124-1, and a first peripheral electrode 123, each of which has a rectangular frame shape that surrounds the detection electrode 121 in plan view.

As depicted in FIGS. 1-3, the electrostatic capacitance detecting device 100 is provided with a plurality of through-holes 130 arranged side by side around the detection electrode 121 to surround the detection electrode 121. The through-holes 130, in which conductor films (for example, copper films) are famed on their inner wall surfaces, are examples of a "lateral electrode". As depicted in FIG. 2, each of the through-holes 130 is provided to pass through the electrostatic capacitance detecting device 100 from the front-side surface of the electrostatic capacitance detecting device 100 (that is, the operating face 100A) to the bottom-side surface of the electrostatic capacitance detecting device 100. As depicted in FIG. 2, each of the through-holes 130 is physically and electrically connected to each of the second peripheral electrode 124-2, the second peripheral electrode 124-1, and the first peripheral electrode 123, and to the stray capacitance coupling conductor 122. Thus, in the electrostatic capacitance detecting device 100 according to the embodiment, each of the multiple through-holes 130 and each of the second peripheral electrode 124-2, the second peripheral electrode 124-1, and the first peripheral electrode 123 together with the stray capacitance coupling conductor 122 are at the same electric potential as that of the detection electrode 121; and as a result, are capacitively coupled with the external ground 10 that is near the electrostatic capacitance detecting device 100, so that capacitive coupling between the external ground 10 and the detection electrode 121 can be prevented. As an example, an inner diameter of each of the through-holes is 0.6 mm, and each of installation intervals of the through-holes is 1.0 mm.

In the electrostatic capacitance detecting device 100 according to the embodiment, the lateral electrodes projects toward the detection face around the detection electrode 121.

As a result, for a case where the operating face 100A is covered with water, a change in the electrostatic capacitance at the detection electrode 121 can be made relatively small. Conversely, in the electrostatic capacitance detecting device 100 according to the embodiment, for a case where the operator's finger approaches the operating face 100A, because the operator's finger is located to face the detection electrode 121, a change in the electrostatic capacitance at the detection electrode 121 is not appreciably affected by the multiple through-holes 130 but is caused only by capacitive coupling with the operator's finger, resulting in that a change in the electrostatic capacitance at the detection electrode 121 can be made relatively large. Therefore, it is possible to distinguish between the case of being covered with water and the case where the operator's finger approaches.

Figure 4:
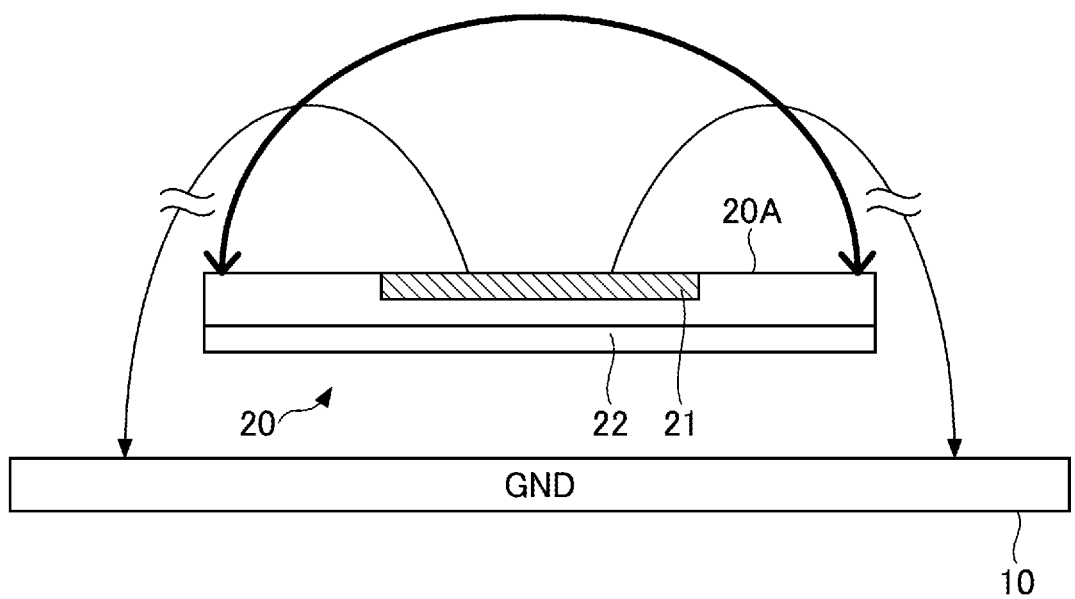
FIG. 4 is a schematic illustration of capacitive coupling by an electrostatic capacitance detecting device according to a comparative example.
Figure 5:
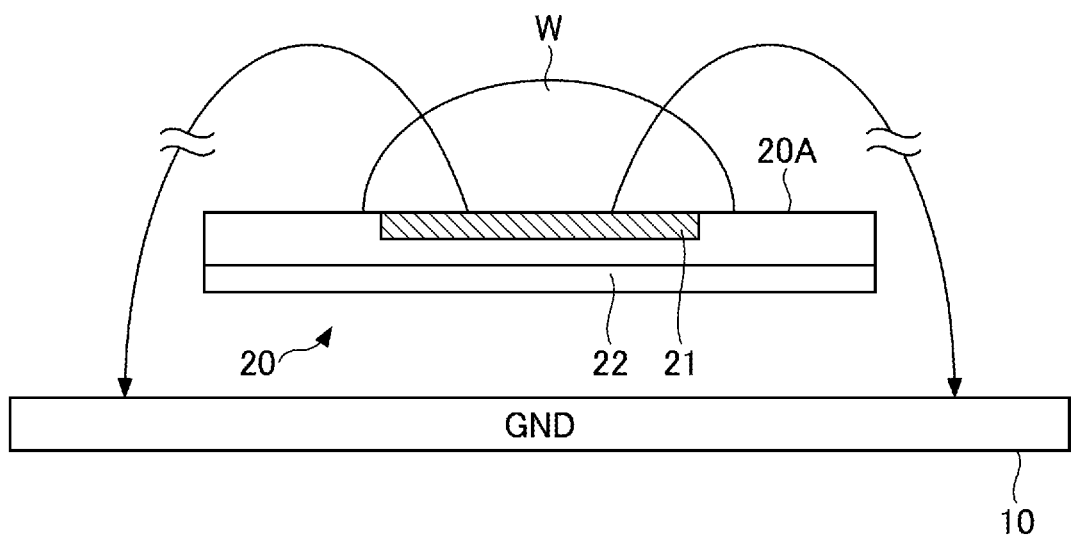
FIG. 5 is a schematic illustration of capacitive coupling by the electrostatic capacitance detecting device according to the comparative example.
Figure 6:
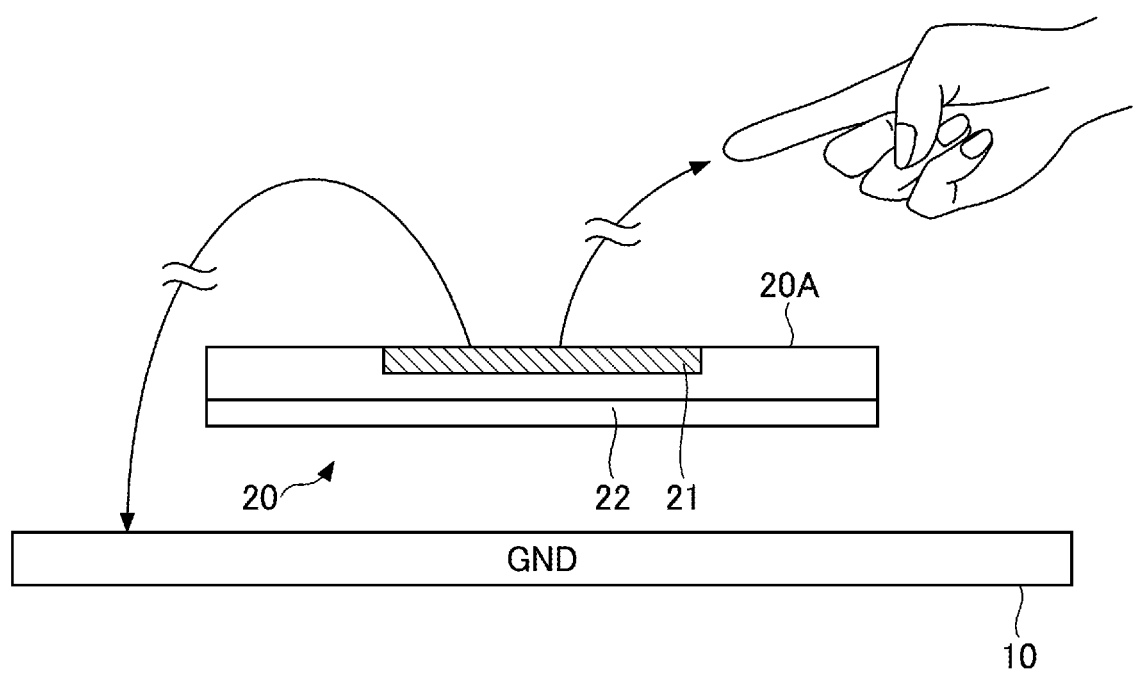
FIG. 6 is a schematic illustration of capacitive coupling by the electrostatic capacitance detecting device according to the comparative example.
Figure 7:
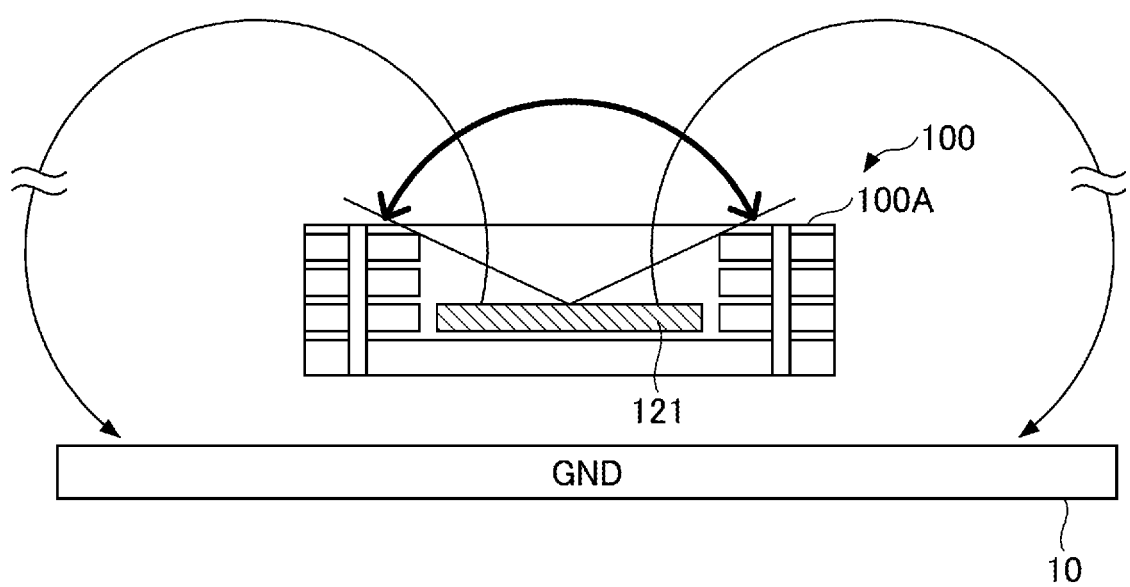
FIG. 7 is a schematic illustration of capacitive coupling by the electrostatic capacitance detecting device according to the embodiment.
Figure 8:
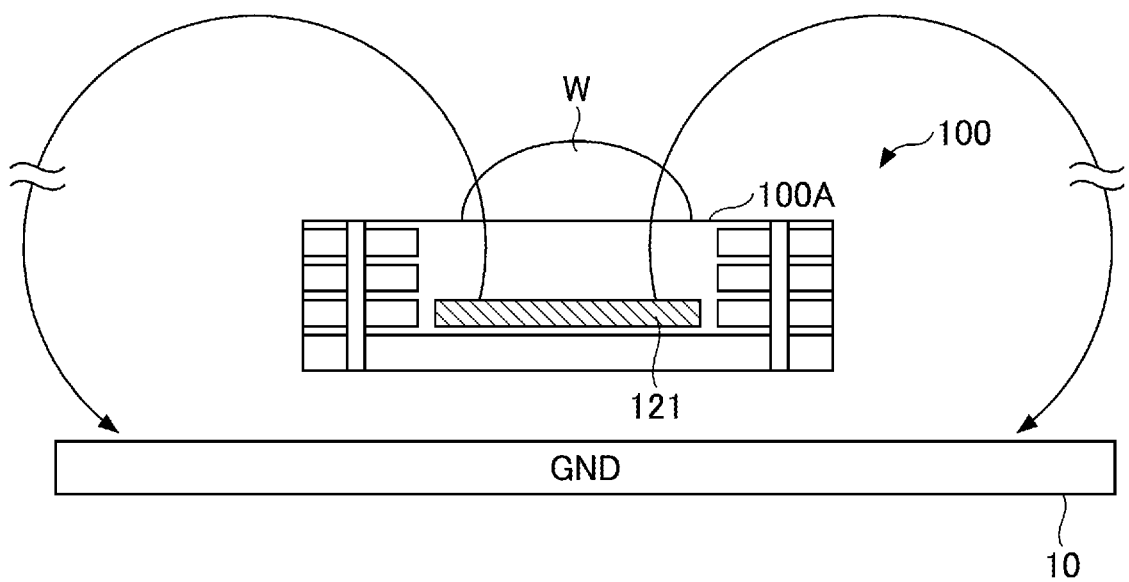
FIG. 8 is a schematic illustration of capacitive coupling by the electrostatic capacitance detecting device according to the embodiment.
Figure 9:
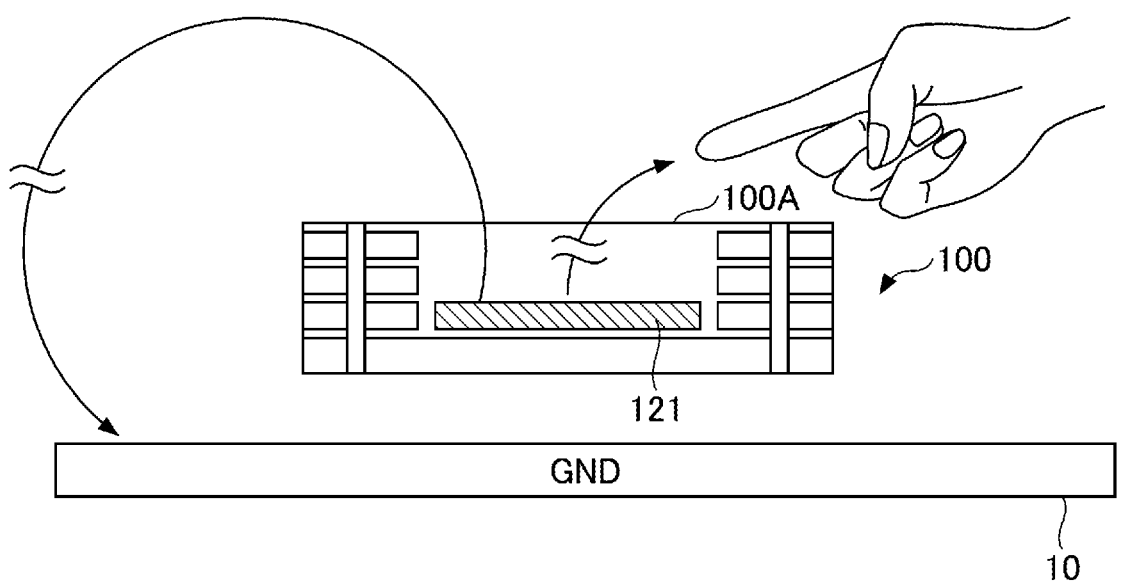
FIG. 9 is a schematic illustration of capacitive coupling by the electrostatic capacitance detecting device according to the embodiment.
Figure 10:
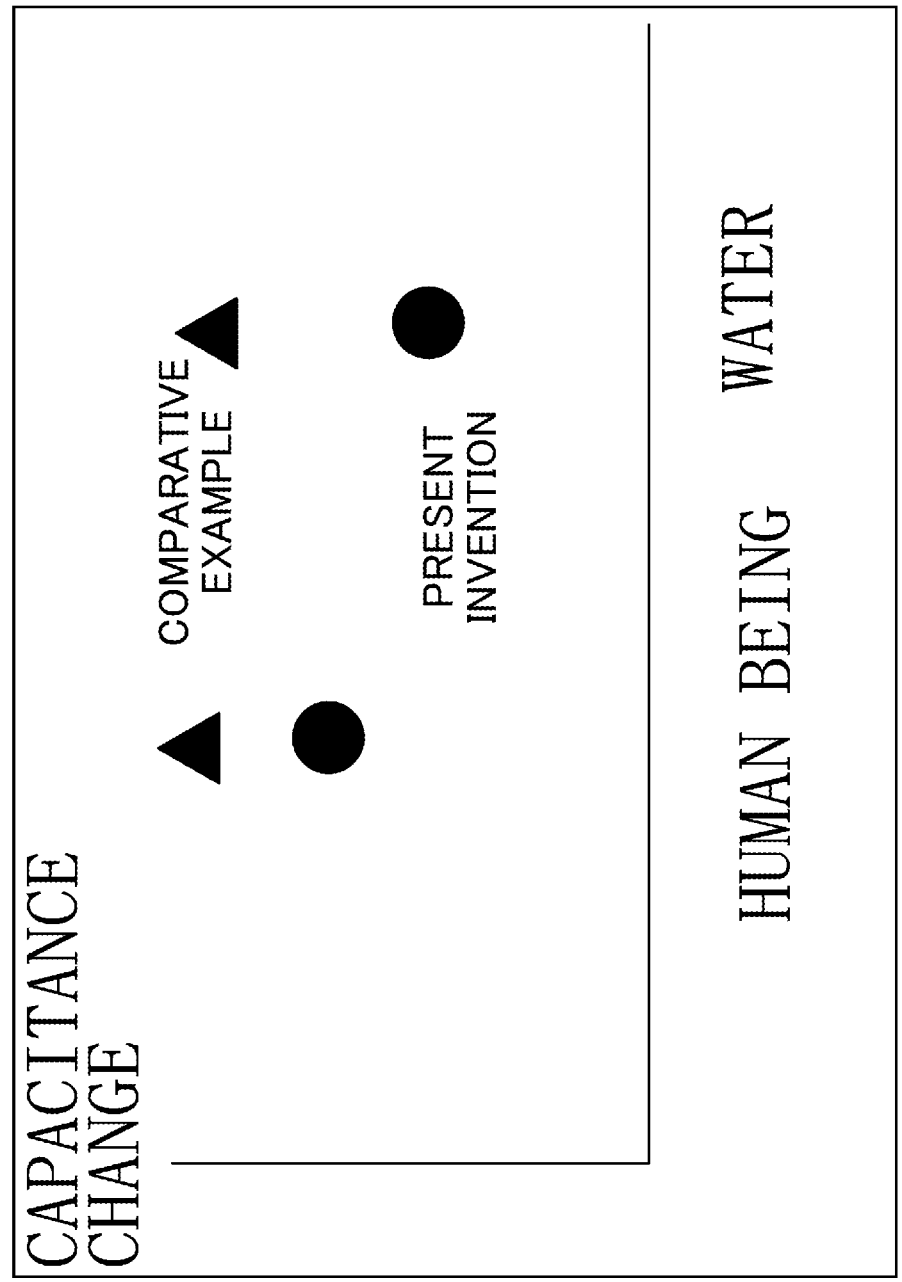
FIG. 10 is a graph depicting a change in an electrostatic capacitance value.

Description will now be made in detail using a comparative example. FIGS. 4-6 schematically depict capacitive coupling in an electrostatic capacitance detecting device 20 of a comparative example. FIGS. 7-9 schematically depict capacitive coupling in the electrostatic capacitance detecting device 100 according to the embodiment. FIG. 10 is a graph depicting a change in an electrostatic capacitance value.

As depicted in FIGS. 4-6, an electrostatic capacitance detecting device 20 in the comparative example includes a detection electrode 21 and a stray capacitance coupling conductor 22. The electrostatic capacitance detecting device 20 in the comparative example differs from the electrostatic capacitance detecting device 100 according to the embodiment in that the detection electrode 21 is provided in a detection face 20A and that the through-holes 130, the second peripheral electrode 124-2, the second peripheral electrode 124-1, and the first peripheral electrode 123 are not provided.

In the electrostatic capacitance detecting device 20 of the comparative example, as depicted in FIG. 4, in an initial state without a finger proximity and without the detection face being covered with water, the detection electrode 21 capacitively couples, by a range of 180 degrees in a cross sectional view, with an external ground 10 that is near. As depicted in FIG. 5, when water W sticks on the detection face 20A, the electrostatic capacitance value changes greatly because the water W, which is a dielectric, intervenes between the detection electrode 21 and the external ground 10. As depicted in FIG. 6, when a finger approaches, the electrostatic capacitance value changes greatly because the human being can be seen as the ground. Therefore, in the electrostatic capacitance detecting device 20 of the comparative example, as depicted by a plot of triangles in FIG. 10, it is difficult to distinguish between the case where the water W sticks on the detection face 20A and the case where the finger approaches because the amounts of changes in the electrostatic capacitance value are almost the same as each other.

In contrast, according to the electrostatic capacitance detecting device 100 of the embodiment, the detection electrode 121 is distant from the operating face 100A and is close to the stray capacitance coupling conductor 122, and in addition, the second peripheral electrode 124-2, the second peripheral electrode 124-1, the first peripheral electrode 123, and the through-holes 130 are provided. As a result, the lateral electrodes protruding toward the operating face 100A are arranged around the detection electrode 121. In the electrostatic capacitance detecting device 100 according to the embodiment, as depicted in FIG. 7, in an initial state without a finger proximity and without the operating face 100A being covered with water, the detection electrode 121 capacitively couples, by an angular range narrower than 180 degrees (e.g., in a range of 100 degrees), with the external ground 10 that is near. Therefore, the electrostatic capacitance value detected by the detection electrode 121 is smaller than that of the comparative example. When water W sticks on the operating face 100A as depicted in FIG. 8, the electrostatic capacitance value changes because the water W, which is a dielectric, intervenes between the detection electrode 121 and the external ground 10. However, because this change in the electrostatic capacitance value is a change in the electrostatic capacitance value in the capacitive coupling with the external ground 10 by the angle range narrower than 180 degrees, the amount of change in the electrostatic capacitance value detected by the detection electrode 121 is smaller than that of the comparative example. When a finger approaches as depicted in FIG. 9, the electrostatic capacitance value detected by the detection electrode 121 is large as in the comparative example because the detection electrode 121 and the finger are capacitively coupled almost regardless of a presence or an absence of the lateral electrodes. Therefore, as depicted by a plot of squares in FIG. 10, according to the electrostatic capacitance detecting device 100 of the embodiment, it is possible to distinguish between the case where water W sticks on the operating face 100A and the case where the finger approaches the operating face 100A, because the amounts of changes in the electrostatic capacitance value are different.

In the electrostatic capacitance detecting device 100 according to the embodiment, in a case where a drive voltage is applied to the stray capacitance coupling conductor 122 so as to change an electric potential of the capacitively coupled detection electrode, it is possible to increase an electrostatic capacitance value between the detection electrode 121 and the stray capacitance coupling conductor 122, electrostatic capacitance values between the detection electrode 121 and the through-holes 130, an electrostatic capacitance value between the detection electrode 121 and the second peripheral electrode 124-2, an electrostatic capacitance value between the detection electrode 121 and the second peripheral electrode 124-1, and an electrostatic capacitance value between the detection electrode 121 and the first peripheral electrode 123. In this case, because these electrostatic capacitances have parallel connection relationships with capacitive coupling between the detection electrode 121 and water W or a finger, it is possible to reduce a change in the electrostatic capacitance value caused when the water W or the finger approaches.

In particular, according to the electrostatic capacitance detecting device 100 of the embodiment, it is possible to relatively easily implement a functional extension of the stray capacitance coupling conductor 122 with respect to the periphery of the detection electrode 121 by forming the plurality of through-holes 130. Therefore, according to the electrostatic capacitance detecting device 100 of the embodiment, a compact electrostatic capacitance detecting device 100 capable of avoiding false detection that would otherwise occur due to water on the operating face 100A can be provided.

A manufacturing method for manufacturing the electrostatic capacitance detecting device 100 according to the embodiment includes, at least: a detection electrode forming step of forming the detection electrode 121 on the front-side surface of the first substrate 111; a stray capacitance coupling conductor forming step of forming the stray capacitance coupling conductor 122 on the back-side surface of the first substrate 111; a first peripheral electrode forming step of forming the first peripheral electrode 123 on the front-side surface of the first substrate 111; and a lateral electrode forming step of forming the plurality of through-holes 130 side by side to surround the detection electrode 121.

First Variant

Figure 11:
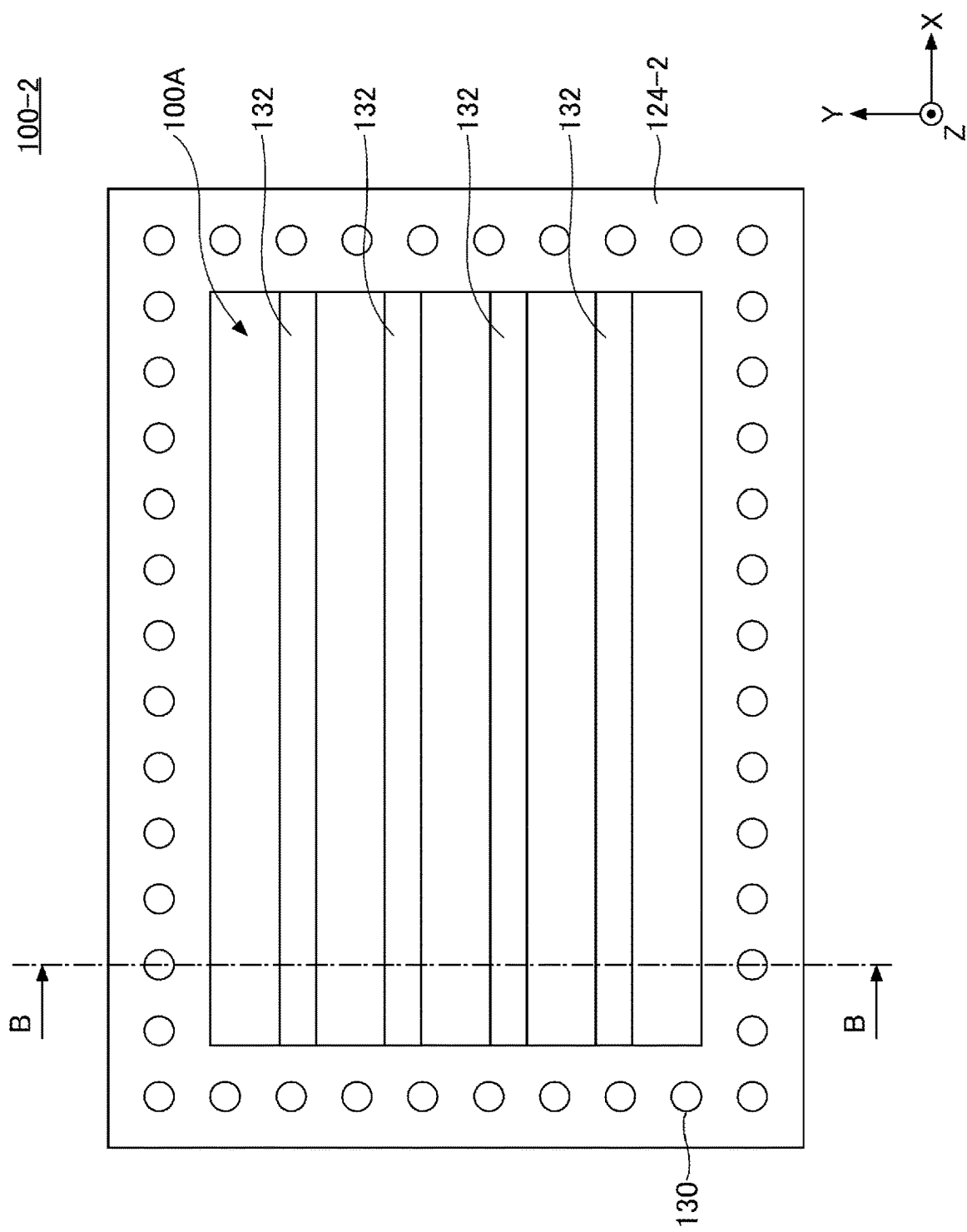
FIG. 11 is a plan view of an electrostatic capacitance detecting device according to a first variant.
Figure 12:
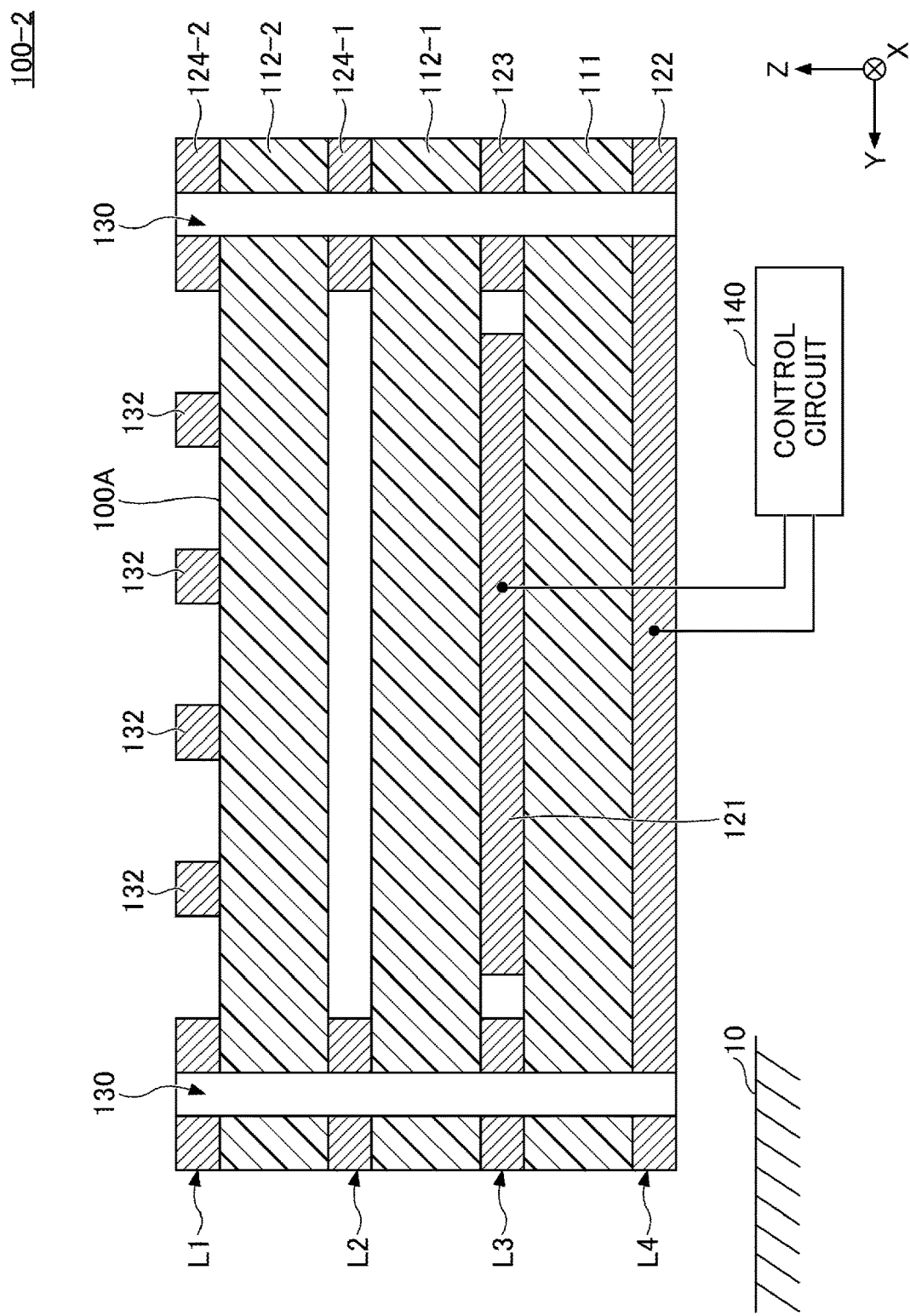
FIG. 12 is a B-B cross sectional view of the electrostatic capacitance detecting device according to the first variant.

Next, referring to FIGS. 11 and 12, a first variant of the electrostatic capacitance detecting device 100 according to the embodiment will be described. FIG. 11 is a plan view of the electrostatic capacitance detecting device 100-2 according to the first variant. FIG. 12 is a B-B cross-sectional view of the electrostatic capacitance detecting device 100-2 according to the first variant.

As depicted in FIGS. 11 and 12, the electrostatic capacitance detecting device 100-2 according to the first variant differs from the electrostatic capacitance detecting device 100 according to the embodiment in that multiple (four, in the example depicted in FIGS. 11 and 12) operating-face electrodes 132 are provided on the operating face 100A (i.e., on the first conductive layer L1).

The multiple operating-face electrodes 132 are strip-shaped electrodes that extend linearly in the X-axis direction. As depicted in FIG. 11, each of the multiple operating-face electrodes 132 is physically and electrically connected to the second peripheral electrode 124-2 at each of their ends. Therefore, each of the multiple operating-face electrodes 132 is electrically connected to the stray capacitance coupling conductor 122 via the second peripheral electrode 124-2 and the multiple through-holes 130. Thus, each of the multiple operating-face electrodes 132 functions as an extension of the stray capacitance coupling conductor 122; and, together with the stray capacitance coupling conductor 122, is at the same electric potential as that of the detection electrode 121.

According to the electrostatic capacitance detecting device 100-2 of the first variant, the range by which the detection electrode capacitively couples with the ground near the electrostatic capacitance detecting device 100-2 can be made further narrower than that in the case of the above-described embodiment, so that a change in the electrostatic capacitance can be made further smaller when the operating face 100A is covered with water. Therefore, according to the electrostatic capacitance detecting device 100-2 of the first variant, an erroneous detection that would otherwise occur due to the operating face 100A being covered with water can be further effectively avoided.

The number of operating-face electrodes 132 may be three or less and may be five or more. The electrostatic capacitance detecting device 100-2 may be equipped with a plurality of operating-face electrodes 132 extending in the X-axis direction. In addition, the electrostatic capacitance detecting device 100-2 may include both a plurality of operating-face electrodes 132 extending in the X-axis direction and a plurality of operating-face electrodes 132 extending in the Y-axis direction (i.e., a plurality of operating-face electrodes 132 that intersect each other).

Second Variant

Figure 13:
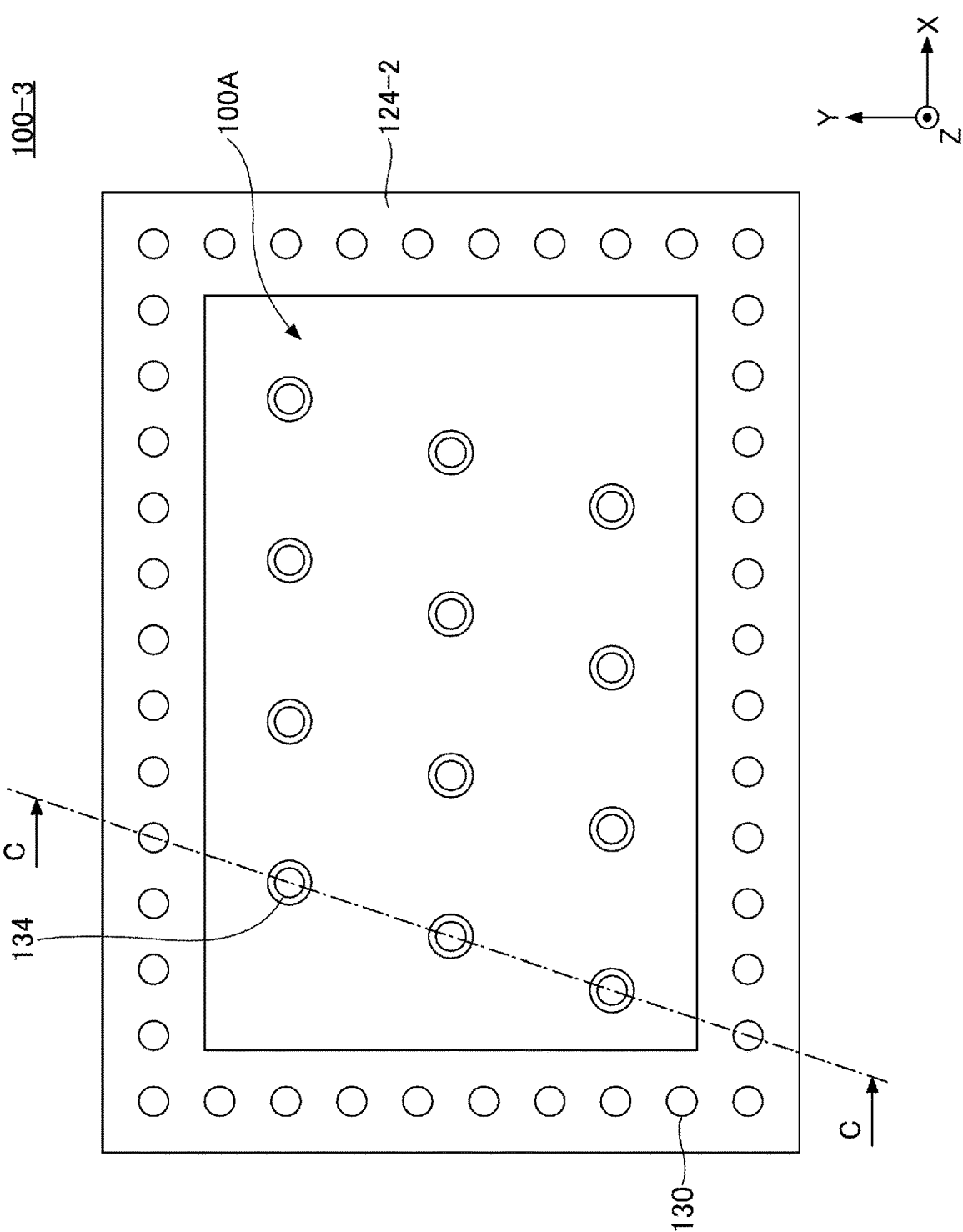
FIG. 13 is a plan view of an electrostatic capacitance detecting device according to a second variant.
Figure 14:
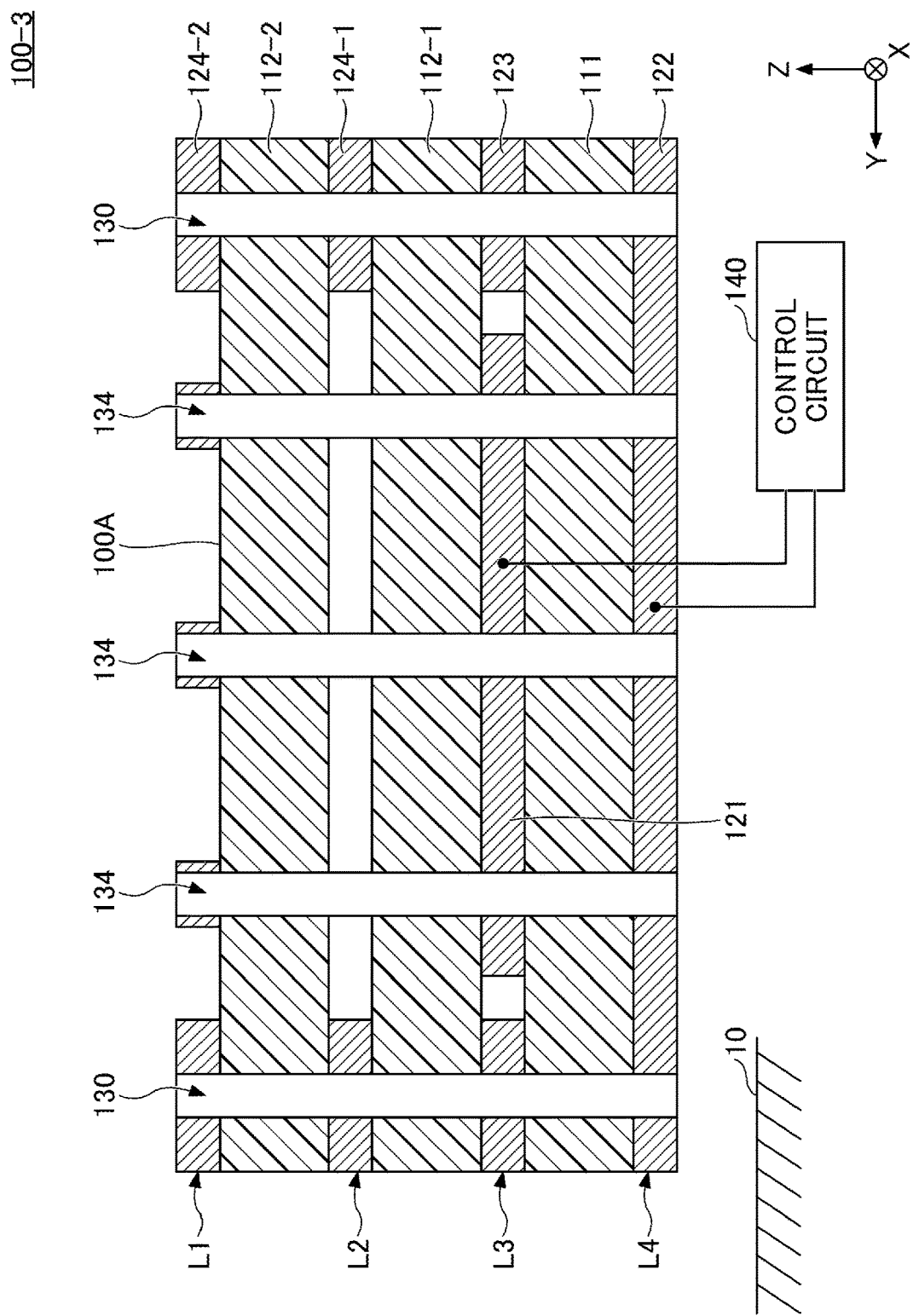
FIG. 14 is a C-C cross sectional view of the electrostatic capacitance detecting device according to the second variant.

Next, referring to FIGS. 13 and 14, a second variant of the electrostatic capacitance detecting device 100 according to the embodiment will be described. FIG. 13 is a plan view of the electrostatic capacitance detecting device 100-3 according to the second variant. FIG. 14 is a C-C cross-sectional view of the electrostatic capacitance detecting device 100-3 according to the second variant.

As depicted in FIGS. 13 and 14, the electrostatic capacitance detecting device 100-3 according to the second variant differs from the electrostatic capacitance detecting device 100 according to the embodiment in that a plurality of second through-holes 134 are provided in an area overlapping the detection electrode 121 in plan view.

Each of the multiple second through-holes 134 is provided to pass through the electrostatic capacitance detecting device 100 from the front-side surface of the electrostatic capacitance detecting device 100 (i.e., the operating face 100A and the first conductive layer L1) to the bottom-side surface of the electrostatic capacitance detecting device 100 (i.e., the fourth conductive layer L4). As depicted in FIG. 14, each of the multiple second through-holes 134 is physically and electrically connected to the stray capacitance coupling conductor 122. Thus, each of the plurality of second through-holes 134 functions as an extension of the stray capacitance coupling conductor 122, and together with the stray capacitance coupling conductor 122, has the same electric potential as that of the detection electrode 121. Each of the multiple second through-holes 134 passes through the detection electrode 121 without being electrically connected to the detection electrode 121.

According to the electrostatic capacitance detecting device 100-3 of the second variant, the range by which the detection electrode capacitively couples with the ground near the electrostatic capacitance detecting device 100-3 can be made further narrower than that in the case of the above-described embodiment, and therefore, a change in the electrostatic capacitance caused when the operating face 100A is covered with water can be made further smaller. Therefore, according to the electrostatic capacitance detecting device 100-3 of the second variant, an erroneous detection that would otherwise occur when the operating face 100A is covered with water can be further effectively avoided.

Third Variant

Figure 15:
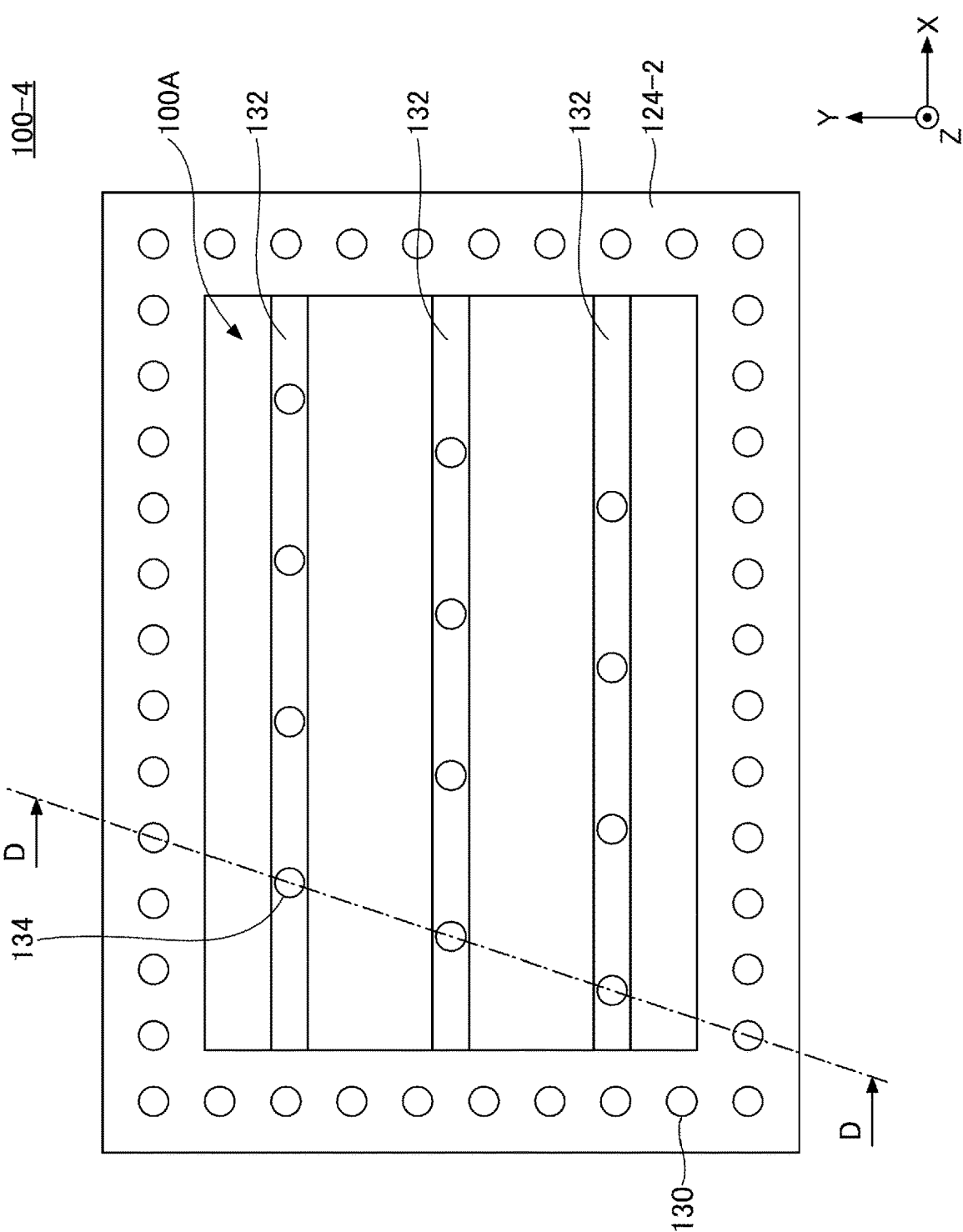
FIG. 15 is a plan view of an electrostatic capacitance detecting device according to a third variant.
Figure 16:
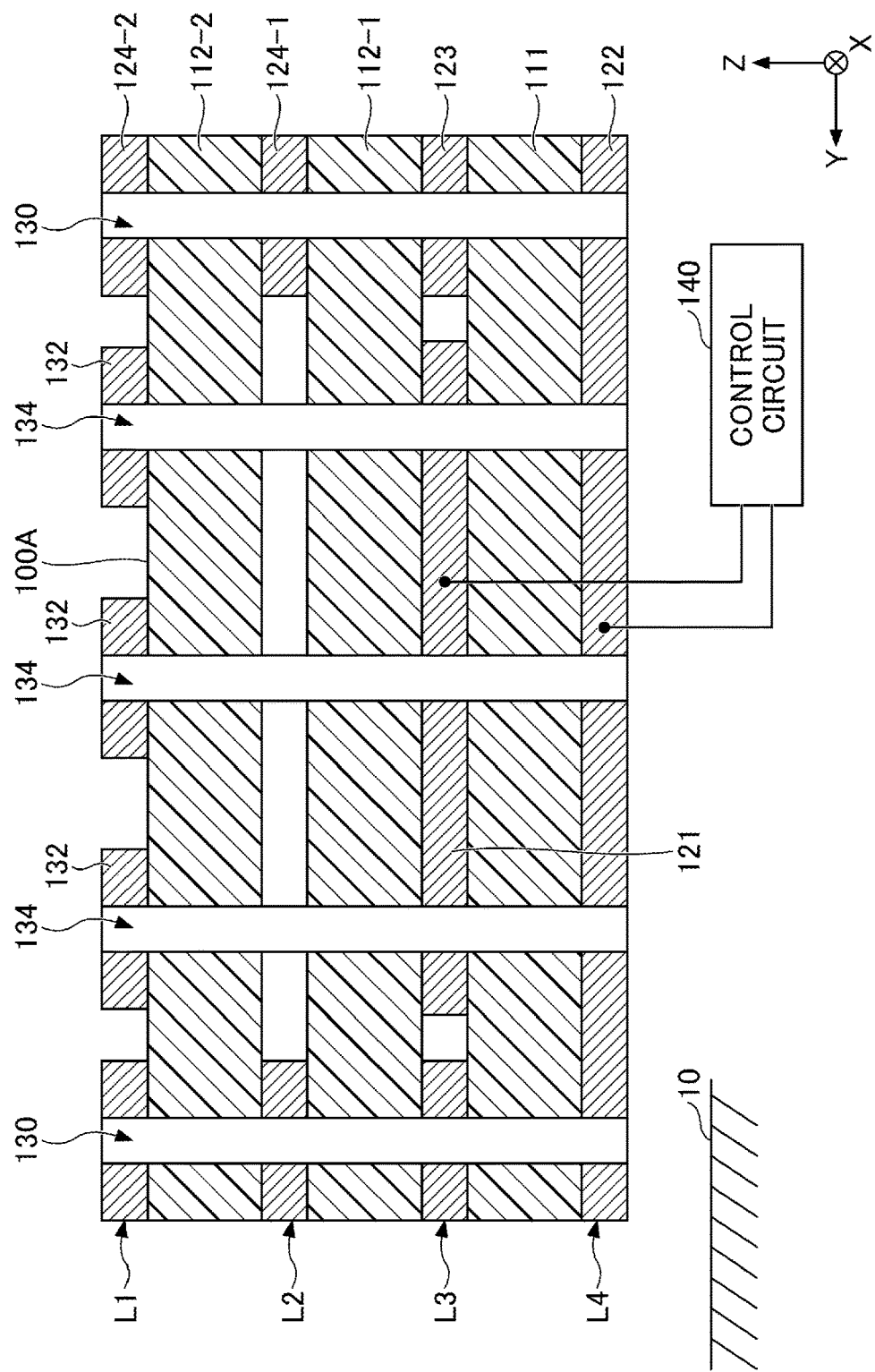
FIG. 16 is a D-D cross sectional view of the electrostatic capacitance detecting device according to the third variant.

Next, referring to FIGS. 15 and 16, a third variant of the electrostatic capacitance detecting device 100 according to the embodiment will be described. FIG. 15 is a plan view of the electrostatic capacitance detecting device 100-4 according to the third variant. FIG. 16 is a D-D cross sectional view of the electrostatic capacitance detecting device 100-4 according to the third variant.

As depicted in FIGS. 15 and 16, the electrostatic capacitance detecting device 100-4 according to the third variant differs from the electrostatic capacitance detecting device 100 according to the embodiment in that the operating face 100A (i.e., the first conductive layer L1) is provided with multiple (three in the example depicted in FIGS. 15 and 16) operating-face electrodes 132 described in the first variant, and each of the multiple operating-face electrodes 132 is connected with multiple second through-holes 134 described in the second variant.

In the electrostatic capacitance detecting device 100-4 according to the third variant, each of the multiple operating-face electrodes 132 and each of the multiple second through-holes 134 are electrically connected to the stray capacitance coupling conductor 122. Thus, according to the electrostatic capacitance detecting device 100-4 of the third variant, each of the multiple operating-face electrodes 132 and each of the multiple second through-holes 134 function as extensions of the stray capacitance coupling conductor 122, and together with the stray capacitance coupling conductor 122, have the same electric potentials as that of the detection electrode 121.

In the electrostatic capacitance detecting device 100-4 according to the third variant, the range by which the detection electrode capacitively couples with the ground near the electrostatic capacitance detecting device 100-4 can be made further narrower than that in the embodiment described above, and therefore, a change in the electrostatic capacitance caused when the operating face 100A is covered with water can be made further smaller. Therefore, according to the electrostatic capacitance detecting device 100-4 of the third variant, an erroneous detection that would otherwise occur when the operating face 100A is covered with water can be further effectively avoided.

According to the electrostatic capacitance detecting device 100-4 of the third variant, the second conductive layer L2 may be provided with operating-face electrodes 132 connected to the second through-holes 134 in the same manner as the first conductive layer L1.

Although the detecting devices and the manufacturing methods have been described with reference to the embodiments, the present invention is not limited to these embodiments, and various modifications or variations can be made within the scope of the present invention.

For example, in the embodiment, the through-holes 130 are used as examples of a lateral electrode, but examples of a lateral electrode are not limited to them; for example, a lateral electrode may have a plate shape or rod shape passing through the substrate, or a lateral electrode may be formed on an inner wall surface of a semi-cylindrical groove (that is, one obtained from the through-hole being divided in half) formed on the lateral surface of the substrate. Alternatively, for example, a lateral electrode may have a wall-like shape arranged to surround the detection electrode.

In addition, for example, in the embodiment, while the electrostatic capacitance detecting device 100 includes the four conductive layers L1-L4, the number of the conductive layers is not limited to this, and, for example, the electrostatic capacitance detecting device may include three or fewer conductive layers, or may include five or more conductive layers.

In addition, for example, in the embodiment, the electrostatic capacitance detecting device 100 includes the two second substrates 112-1 and 112-2, but the number of the second substrates is not limited to this, and, for example, the electrostatic capacitance detecting device may include one second substrate or may include three or more second substrates.

In addition, for example, in the embodiment, the stray capacitance coupling conductor 122 is provided on the back-side surface of the first substrate 111, but the position of the stray capacitance coupling conductor 122 is not limited to this; and, for example, the electrostatic capacitance detecting device may include a third substrate at a position in the back-side direction of the first substrate 111, and the stray capacitance coupling conductor 122 may be provided on the front-side surface of the third substrate or on the back-side surface of the third substrate.

What is claimed is:

1. A detecting device comprising:
   a first substrate;
   a detection electrode provided on a front-side surface of the first substrate and configured to detect a proximity of an operating body to an operating face;
   a stray capacitance coupling conductor provided in a direction with respect to the first substrate, the direction being opposite to a direction of the detection electrode with respect to the first substrate;
   a first peripheral electrode provided on the front-side surface of the first substrate and surrounding the detection electrode; and
   a plurality of lateral electrodes arranged side by side to surround the detection electrode, extending along a thickness direction of the first substrate, and connected to each of the first peripheral electrode and the stray capacitance coupling conductor.

2. The detecting device as claimed in claim 1, wherein:
   the lateral electrodes are through-holes.

3. The detecting device as claimed in claim 2, wherein
   each of installation intervals of the through-holes is shorter than a length of each of the through-holes.

4. The detecting device as claimed in claim 1, further comprising
   one or more second substrates superposed with respect to the front-side surface of the first substrate,
   wherein
   each of the one or more second substrates has a second peripheral electrode provided to surround the detection electrode in plan view, and
   each of the plurality of lateral electrodes is further connected to the second peripheral electrode of each of the one or more second substrates.

5. The detecting device as claimed in claim 1, wherein
   the stray capacitance coupling conductor is provided on the back-side surface of the first substrate.

6. The detecting device as claimed in claim 1, further comprising
   one or more third substrates superposed with respect to the back-side surface of the first substrate,
   wherein
   the stray capacitance coupling conductor is provided at any one of the one or more third substrates.

7. A manufacturing method comprising:
   forming a detection electrode on a front-side surface of a first substrate, the detection electrode being configured to detect a proximity of an operating body to an operating face;
   forming a stray capacitance coupling conductor in a direction with respect to the first substrate, the direction being opposite to a direction of the detection electrode with respect to the first substrate;
   a first peripheral electrode forming step of forming a first peripheral electrode on the front-side surface of the first substrate to surround the detection electrode; and
   forming a plurality of lateral electrodes side by side to surround the detection electrode, the plurality of lateral electrodes extending along a thickness direction of the first substrate and connected to each of the first peripheral electrode and the stray capacitance coupling conductor.

8. The detecting device as claimed in claim 4, wherein:
   the lateral electrodes are through-holes.

9. The detecting device as claimed in claim 8, wherein
   each of installation intervals of the through-holes is shorter than a length of each of the through-holes.

* * * * *